United States Patent
Ito (10) Patent No.: US 8,212,359 B2
(45) Date of Patent: Jul. 3, 2012

(54) SEMICONDUCTOR INTEGRATED CIRCUIT DEVICE, MOUNTING STRUCTURE OF SEMICONDUCTOR INTEGRATED CIRCUIT DEVICE, AND METHOD FOR MANUFACTURING SEMICONDUCTOR INTEGRATED CIRCUIT DEVICE

(75) Inventor: Yuki Ito, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 305 days.

(21) Appl. No.: 12/605,567

(22) Filed: Oct. 26, 2009

(65) Prior Publication Data
US 2010/0038799 A1    Feb. 18, 2010

Related U.S. Application Data

(63) Continuation of application No. PCT/JP2009/050664, filed on Jan. 19, 2009.

(30) Foreign Application Priority Data

Jan. 28, 2008  (JP) .................................. 2008-016977

(51) Int. Cl.
    H01L 23/48    (2006.01)
    H01L 23/52    (2006.01)
    H01L 21/4763  (2006.01)
    H01L 21/44    (2006.01)

(52) U.S. Cl. ................. 257/753; 257/773; 257/E21.575; 257/E21.584; 438/644; 438/645; 438/666

(58) Field of Classification Search .................. 257/753, 257/773, E23.01, E21.575, E21.584; 438/644, 438/645, 666
See application file for complete search history.

(56) References Cited

U.S. PATENT DOCUMENTS

| 4,812,885 | A  | * | 3/1989 | Riemenschneider | 257/316 |
| 5,629,838 | A  | * | 5/1997 | Knight et al. | 361/782 |
| 6,504,248 | B2 | * | 1/2003 | Yoshida et al. | 257/753 |
| 6,559,531 | B1 | * | 5/2003 | Sutherland | 257/686 |
| 6,916,719 | B1 | * | 7/2005 | Knight et al. | 438/381 |
| 7,319,341 | B1 | * | 1/2008 | Harms et al. | 324/754.28 |
| 2002/0063340 | A1 | * | 5/2002 | Sahara et al. | 257/773 |
| 2007/0029646 | A1 | * | 2/2007 | Voldman | 257/662 |

FOREIGN PATENT DOCUMENTS

| JP | 60-46038 A | 3/1985 |
| JP | 11-243109 A | 9/1999 |
| JP | 2006-173476 A | 6/2006 |
| JP | 2006173476 A * | 6/2006 |
| JP | 2007-165402 A | 6/2007 |

OTHER PUBLICATIONS

Official Communication issued in International Patent Application No. PCT/JP2009/050664, mailed on Feb. 10, 2009.

* cited by examiner

*Primary Examiner* — Matthew W Such
*Assistant Examiner* — Jeremy Joy
(74) *Attorney, Agent, or Firm* — Keating & Bennett, LLP (57) ABSTRACT

A semiconductor integrated circuit device can be mounted on a circuit board through capacitive coupling even when being miniaturized. A passivation film disposed on a principal surface of a semiconductor substrate provided with a plurality of wirings laminated sequentially with insulating films therebetween has an opening at which at least a portion of the uppermost layer wiring is exposed. An electrode is arranged to cover the uppermost layer wiring exposed at the opening of the passivation film and the periphery of the opening of the passivation film. A dielectric layer is arranged to cover the electrode. An extension portion of the electrode on the surface of the passivation film and an electrode of a circuit board are capacitively coupled with a dielectric layer therebetween.

10 Claims, 5 Drawing Sheets

SEMICONDUCTOR INTEGRATED CIRCUIT DEVICE, MOUNTING STRUCTURE OF SEMICONDUCTOR INTEGRATED CIRCUIT DEVICE, AND METHOD FOR MANUFACTURING SEMICONDUCTOR INTEGRATED CIRCUIT DEVICE

BACKGROUND OF THE INVENTION

1. Field of the Invention

The present invention relates to a semiconductor integrated circuit device. In particular, it relates to a structure of a semiconductor integrated circuit device, wherein a signal can be transmitted in a non-contact manner without using a bump.

2. Description of the Related Art

Conventional examples of common methods for mounting a semiconductor integrated circuit device include flip chip mounting and wire bonding. In these methods, electrically conductive joint members, e.g., bumps and wires, for connecting semiconductor integrated circuit devices to circuit boards are physically joined to electrodes of semiconductor substrates and, thereby, electrical signals are transmitted in a conduction state.

Figure 5:
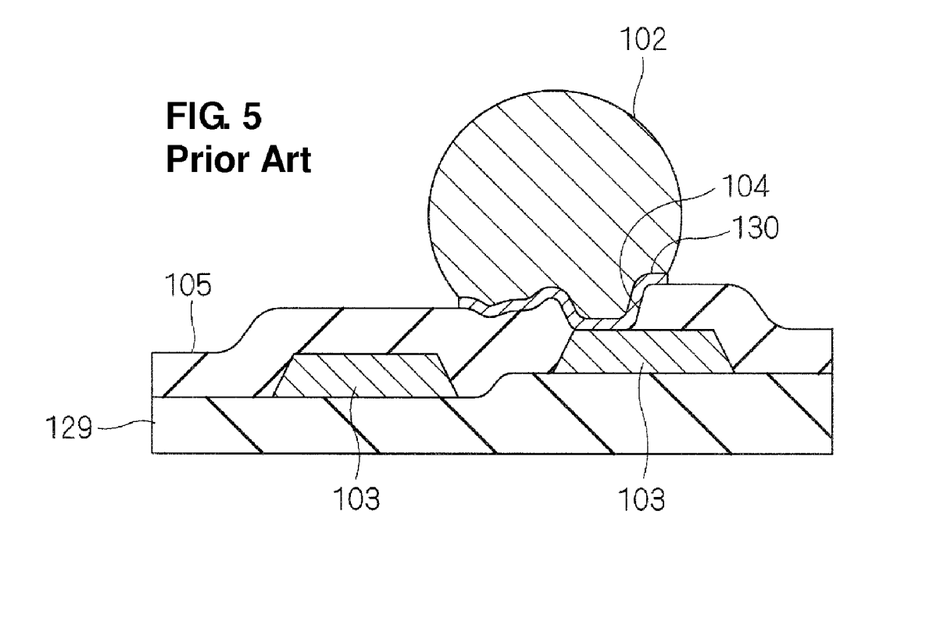
FIG. 5 is a sectional view of a key portion, showing the state in which a semiconductor integrated circuit device is mounted.

For example, as shown in FIG. 5, which is a sectional view of a key portion of a semiconductor integrated circuit device, an opening 104 is formed in a passivation film 105 covering a substrate main body 129 of a semiconductor substrate, a substrate layer 130 is formed on the uppermost layer wiring 103 exposed at the opening 104 and in the periphery of the opening 104 from an electrically conductive material, and a solder bump 102 is joined to the substrate layer 130. The passivation film 105 prevents moisture absorption of insulating layers (not shown in the drawing) laminated on a principal surface of the semiconductor substrate and an occurrence of short-circuiting between the uppermost layer wirings 103 (refer to Japanese Unexamined Patent Application Publication No. 11-243109).

However, in the case where the semiconductor integrated circuit device is miniaturized, adjacent joint members (bumps or the like) come into contact with each other, so that short-circuiting may occur. Therefore, there is a limit to the amount of miniaturization of the semiconductor integrated circuit device.

Figure 6:
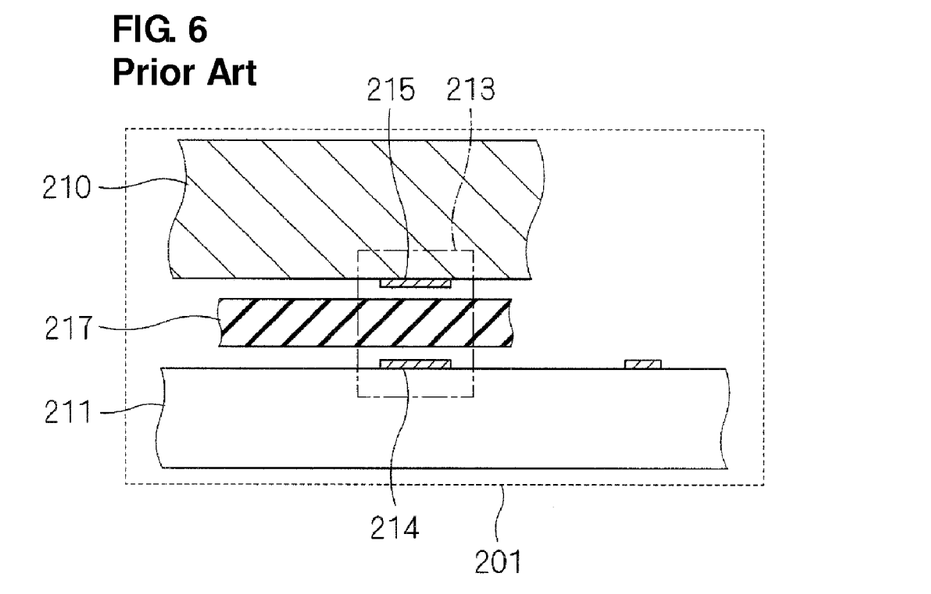
FIG. 6 is a sectional view of a key portion, showing the state in which a semiconductor integrated circuit device is mounted.

On the other hand, a method in which a signal is transmitted in a non-conduction state through the use of capacitive coupling has been proposed. For example, as is indicated in a sectional view shown in FIG. 6, in a modular electronic system 201, for example, a dielectric 217 is filled in a gap between "half capacitors" 214 and 215 and serves as a means 213 for signaling capacitively so as to provide a capacitive signal path between substrates 210 and 211 (refer to, for example, Japanese Unexamined Patent Application Publication No. 2004-253816).

In the case where capacitive coupling is used, joining with an electrically conductive member becomes unnecessary and, therefore, it is easy to prevent an occurrence of short-circuiting.

However, if the area of the pad on the semiconductor substrate side is reduced along with miniaturization of the semiconductor integrated circuit device, a capacitive region between the pad and an electrode formed on the circuit board becomes small and, therefore, there is a problem in that a desired capacitance is not obtained.

SUMMARY OF THE INVENTION

In consideration of the above-described circumstances, preferred embodiments of the present invention provide a semiconductor integrated circuit device which can be mounted on a circuit board through capacitive coupling even when being miniaturized.

A semiconductor integrated circuit device according to a preferred embodiment of the present invention includes a semiconductor substrate in which a plurality of wirings are laminated sequentially on a semiconductor substrate main body with insulating films therebetween, a passivation film disposed on a principal surface of the semiconductor substrate main body that is provided with the laminated wirings, the passivation film having an opening at which at least a portion of an uppermost of the laminated wirings is exposed, an electrode arranged to cover the uppermost wiring exposed at the opening of the passivation film and a periphery of the opening of the passivation film and which includes an extension portion disposed on the portion of the periphery of the opening in the surface of the passivation film, and a dielectric layer arranged so as to cover at least the electrode.

In the above-described configuration, in mounting of the semiconductor integrated circuit device on a circuit board, mounting is conducted in such a way that the extension portion of the electrode of the semiconductor integrated circuit device comes into the state of being opposed to the electrode of the circuit board with the dielectric film of the semiconductor integrated circuit device therebetween and, thereby, electrical connection between the electrode of the semiconductor integrated circuit board and the electrode of the circuit board can be made through capacitive coupling.

According to the above-described configuration, signal transmission between the semiconductor integrated circuit board and the circuit board can be made in a non-conduction state (non-contact state), in which no direct current passes, through the use of capacitive coupling between the electrodes. Therefore, an occurrence of short-circuiting between adjacent electrodes can be prevented.

Furthermore, since a desired coupling capacitance is obtained by adjusting the size of the extension portion or selecting the material and the thickness of the dielectric film appropriately regardless of the area of the uppermost layer wiring, large-capacity signal transmission can be performed even when the semiconductor integrated circuit device is miniaturized.

Moreover, since one principal surface of the semiconductor substrate is covered with the passivation film, moisture absorption of the insulating films of the semiconductor substrate can be prevented.

Preferably, a region in contact with the extension portion of the electrode is flat in the surface of the passivation film.

According to the above-described configuration, the whole extension portion of the electrode comes into the state of being opposed to the electrode of the circuit board with the dielectric film therebetween and, therefore, the capacitive coupling can be achieved through effective use of the area of the extension portion.

Further preferably, an auxiliary layer having a flat surface is further disposed on the surface of the passivation film in such a way as to expose at least a portion of the above-described opening of the above-described passivation film, wherein the above-described extension portion of the above-described electrode is disposed on a surface of the above-described auxiliary layer.

According to the above-described configuration, since the extension portion is formed on the auxiliary layer having a flat surface, the whole extension portion of the electrode comes into the state of being opposed to the electrode of the circuit board. Consequently, even in the case where the passivation film has unevenness, the capacitive coupling between the extension portion and the electrode of the circuit board can be achieved through effective use of the area of the extension portion.

Preferably, an adhesive resin is filled in a concave portion on the surface side of the passivation film and surfaces of the passivation film and the adhesive resin are included in the same plane.

According to the above-described configuration, even in the case where the surface of the passivation film has unevenness, the semiconductor integrated circuit device can be mounted stably by filling the adhesive resin into the concave portion of the surface side of the passivation film so as to flatten the surfaces of the passivation film and the adhesive resin and adhering the surface of the adhesive resin to the circuit board.

In addition, another preferred embodiment of the present invention provides a mounting structure of a semiconductor integrated circuit device.

The mounting structure of a semiconductor integrated circuit device includes the semiconductor integrated circuit device having any one of the above-described configurations and a circuit board for mounting the semiconductor integrated circuit device. The extension portion of the electrode of the semiconductor integrated circuit board is opposed to a surface of the electrode of the circuit board with the dielectric film of the semiconductor integrated circuit board therebetween.

According to the above-described configuration, capacitive coupling between the extension portion of the electrode of the semiconductor integrated circuit device and the electrode of the circuit board can be achieved. Mounting on the circuit board can be conducted by selecting the size and the shape of the extension portion of the electrode and the material and the thickness of the dielectric film appropriately even when the semiconductor integrated circuit device is miniaturized.

In addition, a further preferred embodiment of the present invention provides a method for manufacturing a semiconductor integrated circuit device having the following configuration.

The method for manufacturing a semiconductor integrated circuit device includes the steps of forming a semiconductor substrate having a plurality of wirings laminated sequentially on a semiconductor substrate main body with insulating films therebetween, forming a passivation film on a principal surface of the semiconductor substrate main body that is provided with the laminated wirings, the passivation film having an opening, at which at least a portion of an uppermost of the wirings is exposed, forming an electrode that covers the opening and the periphery of the opening of the passivation film and which includes an extension portion disposed on the portion of the periphery of the opening in the surface of the passivation film, and (4) forming a dielectric layer so as to cover at least the electrode.

According to the semiconductor integrated circuit device produced by the above-described method, signal transmission between the semiconductor integrated circuit board and the circuit board can be made in a non-conduction state (non-contact state), in which no direct current passes, through the use of capacitive coupling between the electrodes. Therefore, an occurrence of short-circuiting between adjacent electrodes can be prevented.

Furthermore, since a desired coupling capacitance is obtained by adjusting the size of the extension portion or selecting the material and the thickness of the dielectric film appropriately regardless of the area of the uppermost layer wiring, large-capacity signal transmission can be performed even when the semiconductor integrated circuit device is miniaturized.

Moreover, since one principal surface of the semiconductor substrate is covered with the passivation film, moisture absorption of the insulating films of the semiconductor substrate can be prevented.

Preferably, the method further includes the step of forming an auxiliary layer having a flat surface on a surface of the passivation film so as to expose at least a portion of the opening of the passivation film after the step of forming a passivation film.

In this regard, even in the case where the passivation film has unevenness, the extension portion of the electrode can be formed having a flat surface by the auxiliary layer.

Preferably, in the step of forming an electrode, the electrode is formed by forming a film of an electrically conductive material along the passivation film.

In this case, the electrode can be formed easily by forming the film of the electrically conductive material by a method of evaporation, sputtering, or other suitable process.

Preferably, the method further includes the step of disposing an adhesive resin in a concave portion on the surface side of the dielectric film in such a way that unevenness of the surface side of the dielectric film is flattened.

In this case, even when the surface of the dielectric has unevenness, the semiconductor integrated circuit device can be mounted stably by flattening the surfaces with the adhesive resin and adhering the surface of the adhesive resin to the circuit board.

Preferably, in the step of disposing an adhesive resin, after the adhesive resin is disposed on the surface side of the passivation film, the adhesive resin is polished until at least a portion of the dielectric film that covers the extension portion of the electrode, is exposed.

In this case, in mounting of the semiconductor integrated circuit device on the circuit board, only the dielectric layer is disposed between the electrode on the semiconductor integrated circuit device side and the electrode on the circuit board side, and a good capacitive coupling state can be realized.

Preferably, in the step of disposing an adhesive resin, the adhesive resin in an uncured state is contact-bonded to the dielectric layer.

In this case, the adhesive resin can be disposed easily on the surface side of the dielectric layer.

Preferably, in the step of disposing an adhesive resin, the adhesive resin in an uncured state is applied to the dielectric layer.

In this case, the adhesive resin can be disposed easily on the surface side of the dielectric layer.

According to a preferred embodiment of the present invention, the semiconductor integrated circuit device can be mounted on the circuit board through capacitive coupling even when being miniaturized.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 2A-1 through 2D-2 are sectional views of a key portion, showing production steps of forming a semiconductor integrated circuit device.

FIGS. 3E-1 through 3F-2 are sectional views of a key portion, showing production steps of forming a semiconductor integrated circuit device.

DETAILED DESCRIPTION OF THE PREFERRED EMBODIMENTS

The examples according to preferred embodiments of the present invention will be described below with reference to FIG. 1 to FIG. 4F.

Example 1

A semiconductor integrated circuit device of Example 1 will be described with reference to FIG. 1 to FIG. 3F-2.

Figure 1:
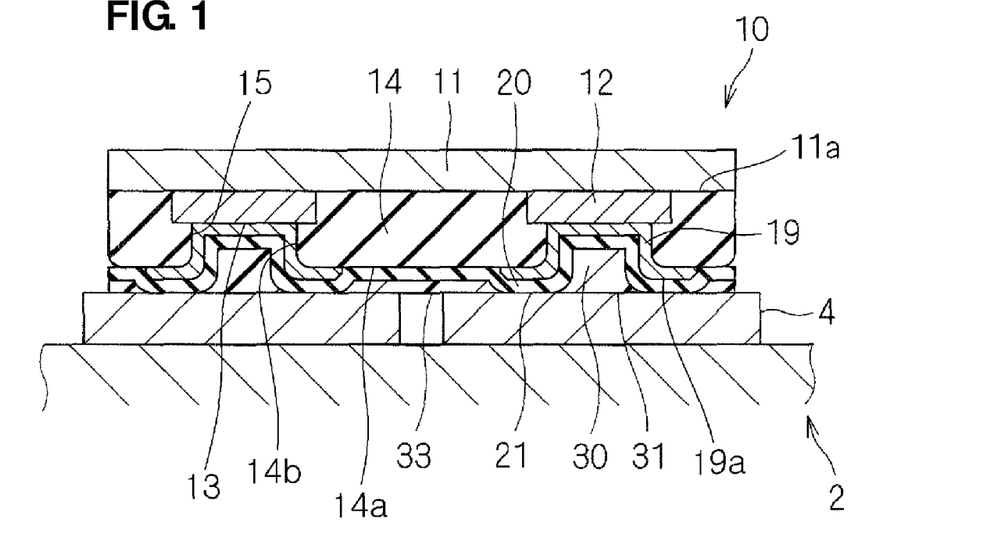
FIG. 1 is a sectional view of a key portion, showing the state in which a semiconductor integrated circuit device is mounted.

FIG. 1 is a sectional view of a key portion, showing the state in which a semiconductor integrated circuit device 10 is mounted on a circuit board 2.

In the semiconductor integrated circuit device 10, a passivation film 14 is disposed on one principal surface (lower surface in the drawing) 11a of a semiconductor substrate 11 and the uppermost layer wiring 12. An opening 15 is disposed in the passivation film 14, and a pad 13 is formed from a portion of the uppermost layer wiring 12 that is exposed at the opening 15 of the passivation film 14.

An electrode 19 is disposed on the pad 13 and a side surface 14b and a surface 14a in the vicinity of the opening 15 of the passivation film 14. An extension portion 19a of the electrode 19, which is disposed on the surface 14a of the passivation film 14, extends parallel or substantially parallel to a lower surface 11a of the semiconductor substrate 11. That is, a region of the surface of the passivation film 14, which is in contact with the extension portion 19a, is arranged so as to be flat and parallel or substantially parallel to the lower surface 11a of the semiconductor substrate 11.

The passivation film 14 and the electrode 19 are covered with a dielectric layer 20. Since the dielectric 20 is arranged along the passivation film 14 and the electrode 19, a portion provided with the uppermost layer wiring 12 and the electrode 19 constitutes a concave portion and, therefore, unevenness is formed on the surface of the dielectric layer 20. Then, an adhesive resin 30 is filled in the concave portion and, thereby, the surface 21 of the dielectric layer 20 and the surfaces 31 and 33 of the adhesive resin 30 are included in the same plane.

The semiconductor integrated circuit device 10 is mounted on the circuit board 2 while the surfaces 31 and 33 of the adhesive resin 30 are adhered to the electrode 4 of the circuit board 2 and the electrode 19 of the semiconductor integrated circuit device 10 is opposed to the electrode 4 of the circuit board 2. The dielectric layer 20 is disposed between the extension portion 19a of the electrode 19 of the semiconductor integrated circuit device 10 and the electrode 4 of the circuit board 2, and capacitive coupling is achieved between the extension portion 19a of the electrode 19 of the semiconductor integrated circuit device 10 and the electrode 4 of the circuit board 2.

Next, production steps of the semiconductor integrated circuit device will be described with reference to FIGS. 2A-1 to 2D-2 and FIGS. 3E-1 to 3F-2. FIGS. 2A-1, 2B-1, 2C-1, 2D-1, 3E-1 and 3F-1 on the left side are sectional views of the key portion of the semiconductor integrated circuit device 10. FIGS. 2A-2, 2B-2, 2C-2, 2D-2, 3E-2 and 3F-2 on the right side are plan views of the key portion of the semiconductor integrated circuit device, viewed along arrows shown in FIGS. 2A-1, 2B-1, 2C-1, 2D-1, 3E-1 and 3F-1 on the left side.

Figure 2A:
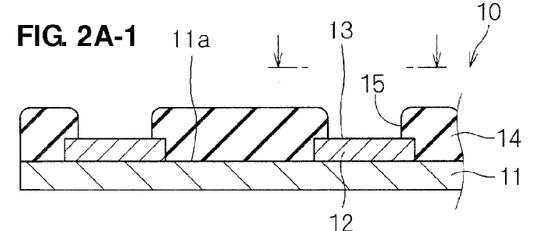
Figure 2A:
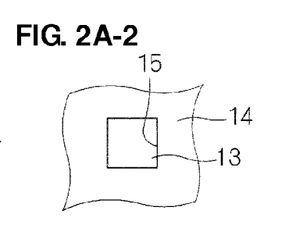
Figure 2B:
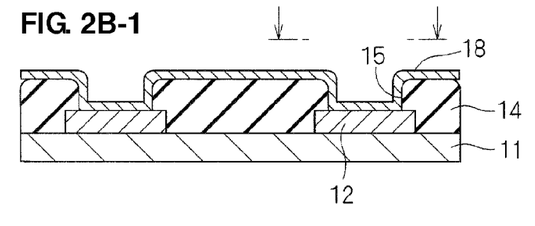
Figure 2B:
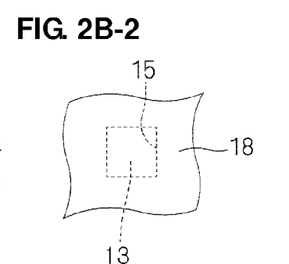
Figure 2C:
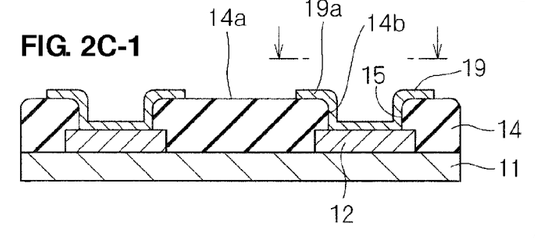
Figure 2C:
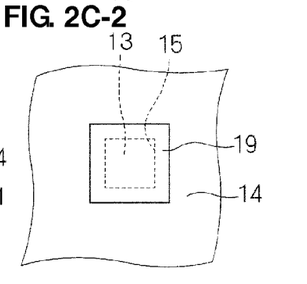
Figure 2D:
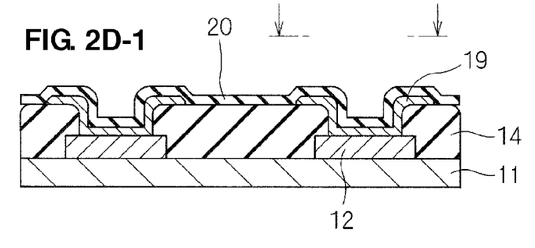
Figure 2D:
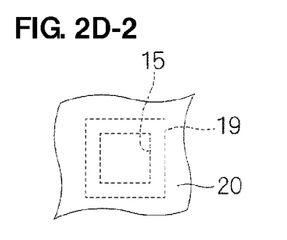

Initially, as shown in FIGS. 2A-1 and 2A-2, a semiconductor substrate 11 provided with the passivation film 14 on the principal surface 11a is prepared. Although not shown in the drawing, in the semiconductor substrate 11, a plurality of wirings are laminated sequentially on a substrate main body with insulating films therebetween. The opening 15 is disposed in the passivation film 14, and the pad 13 is formed from the uppermost layer wiring 12 exposed at the opening 15. The passivation film 14 is formed preferably by using phospho-silica-glass (PSG), boron B-containing PSG (BPSG), $SiN_x$, $SiO_2$, or other suitable material. The uppermost layer wiring 12 is preferably formed from Al, Cu, or other suitable material.

Subsequently, as shown in FIGS. 2B-1 and 2B-2, a metal electrically conductive film 18 is formed on the pad 13 and the passivation film 14 through sputtering, evaporation, plating, or the like. The electrically conductive film 18 is formed by using, for example, TiW, Ni, Mo, W, or Ti in such a way that the thickness becomes about 30 nm to about 2,000 nm, and preferably about 100 nm to about 1,000 nm, for example. In the electrically conductive film 18, at least two layers may be laminated.

Thereafter, as shown in FIGS. 2C-1 and 2C-2, the electrically conductive film 18 is patterned by a method of, for example, etching. At this time, the electrically conductive film 18 in the portion on the pad 13 and the periphery thereof is left and the other portion is removed, so that the electrode 19 larger than the pad 13 is formed. That is, the electrode 19 is formed so as to extend from the pad 13 to the side surface 14b and the surface 14a of the passivation film 14. The surface of the electrode 19 may be polished.

Then, as shown in FIGS. 2D-1 and 2D-2, the dielectric layer 20 is formed all over the surfaces of the passivation film 14 and the electrode 19 by a method of, for example, sputtering or evaporation. The dielectric layer 20 is formed by using a dielectric material, e.g., $SiN_x$, $Ta_2O_5$, $TiO_2$, or $BaTiO_3$, in such a way that the thickness becomes about 50 nm or more. In this regard, it is further preferable that the thickness of the dielectric layer 20 is 100 nm or more in order to ensure the insulating property.

Figure 3E:
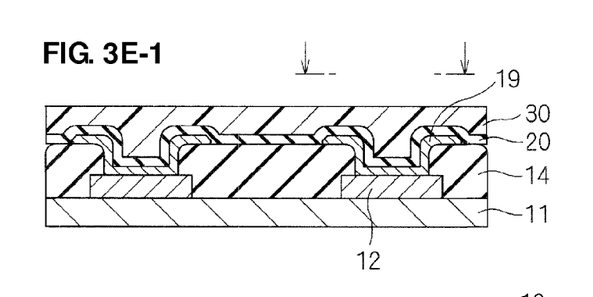
Figure 3E:
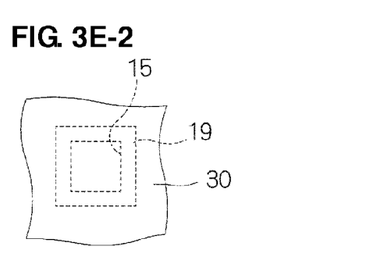

Next, as shown in FIGS. 3E-1 and 3E-2, the adhesive resin 30 in the uncured state is disposed all over the surface of the dielectric layer 20. For example, a thermoplastic adhesive, e.g., a liquid polyimide resin, is applied through spin coating. Alternatively, a sheet of the adhesive resin 30 in the uncured state may be contact-bonded to all over the surface of the dielectric layer 20.

Figure 3F:
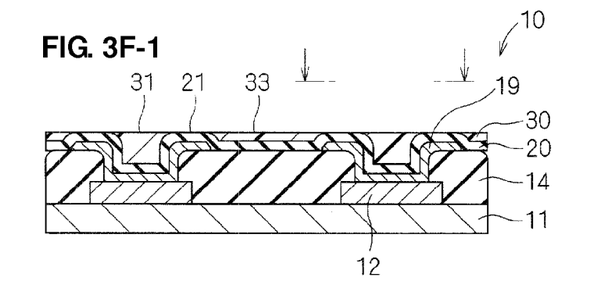
Figure 3F:
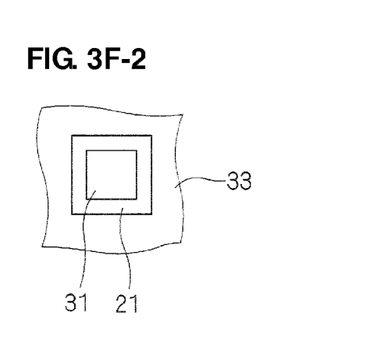

Subsequently, as shown in FIGS. 3F-1 and 3F-2, the adhesive resin 30 is polished until at least a portion of the dielectric film 20, which covers the extension portion 19a of the electrode 19, is exposed. For example, the adhesive resin 30 formed from a thermoplastic adhesive is polished by a chemical mechanical polishing (CMP) method. In this manner, the planes 21, 31, and 33 of both the dielectric layer 20 and the adhesive resin 30, which are exposed at the surface, are flattened, so that the semiconductor integrated circuit device 10 is completed.

Thereafter, as indicated by the sectional view shown in FIG. 1, the semiconductor integrated circuit device 10 is mounted on the circuit board 2. The surfaces 31 and 33 of the adhesive resin 30 of the semiconductor integrated circuit device 10 are adhered to the surface of the electrode 4 of the circuit board 2 while the pad 13 of the semiconductor integrated circuit device 10 and the electrode 4 of the circuit board 2 are opposed to each other. That is, the adhesive resin 30 is cured while the surfaces 31 and 33 of the adhesive resin 30 are in contact with the surface of the electrode 4 of the circuit board 2. The semiconductor integrated circuit device 10 can be mounted on the circuit board 2 stably with the adhesive resin 30 filled in such a way as to flatten the unevenness formed by the passivation film 14, the uppermost layer wiring 12, and the dielectric layer 20.

The electrode 4 of the circuit board 2 is, for example, an external electrode of a radiation plate of a radio frequency IC device (RF-ID) and is formed by using Al, Cu, Ag, Au, W, Mo, Ti, Ni, or other suitable material.

Regarding the semiconductor integrated circuit device 10 of Example 1, the extension portion 19a of the electrode 19 is formed having any shape outside the pad 13 and, thereby, it is possible to increase the area of the electrode, which is capacitively coupled to the electrode 4 of the circuit board 2, on the semiconductor integrated circuit device 10 side. Consequently, a capacitance capable of transmitting a signal can be formed by enlarging the extension portion 19a of the electrode 19 through the use of the surface area of the semiconductor substrate 11 and forming the dielectric layer 20 having a thickness capable of ensuring the insulating property even in the case of a low relative dielectric constant material, as compared with that in a common capacitive coupling method in which capacitive coupling is achieved while the pad 13 of the semiconductor integrated circuit device 10 and the electrode 4 of the circuit board 2 are simply arranged to oppose to each other. Furthermore, since the dielectric layer 20 can contact the surface of the electrode 4 of the circuit board 2 reliably, capacitive coupling can be achieved with a low loss.

For example, in the case where an IC chip of RF-ID, which was operated in a UHF band (850 MHz to 960 MHz), and a radiation plate were capacitively coupled, the IC chip was able to be operated while an opening of approximately 60 μm×60 μm, for example, was disposed in a passivation film of the IC chip, an electrode of approximately 100 μm×100 μm, for example, larger than the opening was formed, an electrode in the shape of a rectangular frame having a width of about 20 μm was capacitively coupled to a radiation plate with a $Ta_2O_5$ ($\epsilon r=25$) dielectric layer having a thickness of about 230 nm therebetween so as to form a capacitance of about 6 pF.

In the case where the semiconductor integrated circuit device 10 is mounted on the electrode 4 of the circuit board 2 through capacitive coupling, the gap between the electrodes can be reduced and the ESD resistance characteristic is good as compared with that in the case where mounting is conducted by a common conductive connection method. In the case where mounting is conducted by a common conductive connection method, a thick bump formed from a material, such as Au, is used. However, in the case where mounting is conducted through capacitive coupling, no bump is required. Consequently, the overall cost can be reduced due to the reduced material and manufacturing cost of the bump, and the thickness can be reduced by the height of the bump. Incidentally, in the present example, the dielectric layer 20 is formed preferably so as to cover all over the surface of the passivation film 14, but it is enough that the dielectric layer 20 covers at least the electrode 19.

Example 2

A semiconductor integrated circuit device of Example 2 will be described with reference to FIGS. 4A-4F.

The semiconductor integrated circuit device of Example 2 has nearly the same configuration as that of the semiconductor integrated circuit device 10 of Example 1. Hereafter the explanation will be made with an emphasis on the points different from Example 1. The same constituent elements as those in Example 1 are indicated by the same reference numerals as those set forth above.

Production steps of the semiconductor integrated circuit device of Example 2 will be described with reference to sectional views shown in FIGS. 4a-4F.

Figure 4A:
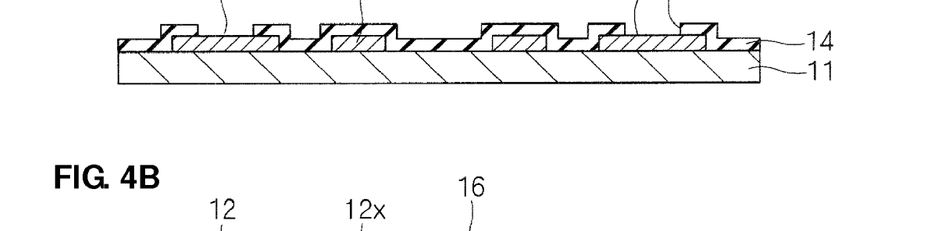
FIGS. 4A-4F are sectional views of a key portion, showing production steps of forming a semiconductor integrated circuit device.

Initially, as in Example 1 and as shown in FIG. 4A, the semiconductor substrate 11 provided with the passivation film 14 on the principal surface 11a is prepared. Although not shown in the drawing, in the semiconductor substrate 11, a plurality of wirings are laminated sequentially on a substrate main body with insulating films therebetween. The opening 15 is disposed in the passivation film 14, and the pad 13 is formed from the uppermost layer wiring 12 exposed at the opening 15. The portions other than the pad 13 of the uppermost layer wirings 12 and 12x formed from Al or the like are covered with the passivation film 14. The surface of the passivation film 14 is not flat, but unevenness is formed because of presence or absence of the uppermost layer wirings 12 and 12x and the like.

Figures 4B, 4C:
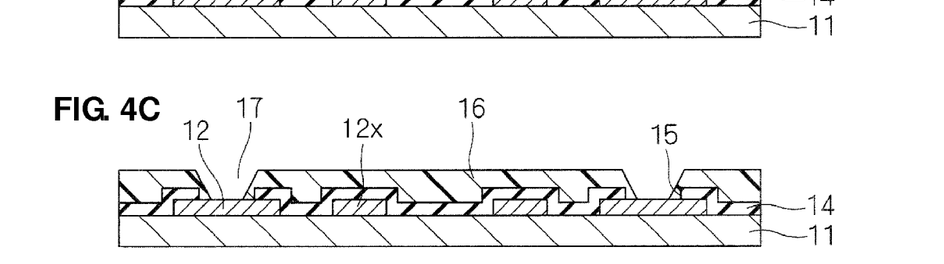

Subsequently, in contrast to Example 1, as shown in FIG. 4B, a photosensitive resin is applied to the pad 13 and the passivation film 14 through spin coating, so that an auxiliary layer 16 is formed.

Then, as shown in FIG. 4C, the photosensitive resin auxiliary layer 16 is patterned by using a photolithography technology so as to form an opening 17 at which the pad 13 is exposed.

Figure 4D:
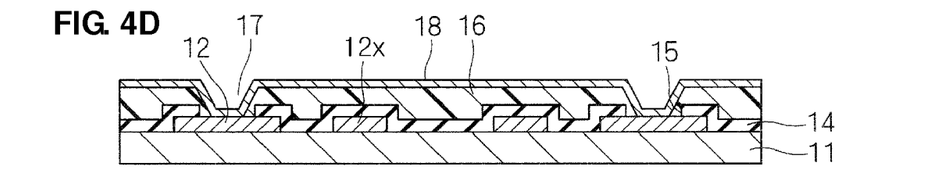
Figure 4E:
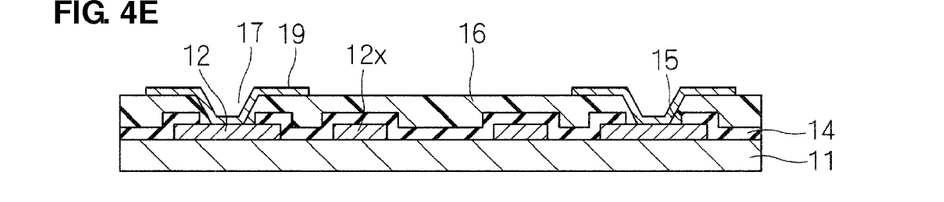
Figure 4F:
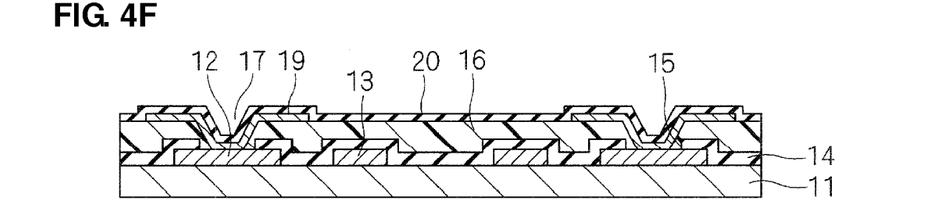

Thereafter, the semiconductor integrated circuit device is produced as in Example 1. That is, as shown in FIG. 4D, a metal electrically conductive film 18 is formed all over the outer surface of the auxiliary layer 16 and the pad 13 by a method of sputtering, evaporation, plating, or other suitable process. For example, a film of Ti/TiCu is formed. Next, as shown in FIG. 4E, the electrically conductive film 18 is patterned by a method of, for example, etching, so that the electrode 19 larger than the pad 13 is formed. Subsequently, as shown in FIG. 4F, a film of $Ta_2O_5$ is formed by, for example, a sputtering method so as to form the dielectric layer 20. Consequently, the semiconductor integrated circuit device is completed.

The resulting semiconductor integrated circuit device is mounted on a circuit board by being resin-molded while the extension portion of the electrode is arranged opposing to the electrode of the circuit board.

In the semiconductor integrated circuit device of Example 2, the surface having unevenness of the passivation film 14 is covered with the auxiliary layer 16, and the electrode 19 and the dielectric layer 20 are disposed on a flat surface 16a of the auxiliary layer 16. Therefore, the extension portion 19a of the electrode 19 and the electrode 4 of the circuit board 2 can be opposed in parallel and sufficient capacitive coupling can be formed therebetween.

The semiconductor integrated circuit device 10 described above can be mounted in such a way that the extension portion 19a of the electrode 19 located on a protuberance portion outside the pad 13 (surface 14a of the passivation film 14) is capacitively coupled to the electrode 4 of the circuit board 2 with the dielectric layer 20 therebetween, even when the semiconductor integrated circuit device 10 is miniaturized.

Incidentally, the present invention is not limited to the above-described preferred embodiments and can be executed while various modifications are applied.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor integrated circuit device comprising:
    a semiconductor substrate including a semiconductor substrate main body and a plurality of wirings laminated sequentially on the semiconductor substrate main body with insulating films therebetween;
    a passivation film disposed on a surface of the semiconductor substrate main body on which the wirings are disposed, the passivation film including a surface having an opening at which at least a portion of an uppermost of the wirings is exposed;
    an electrode arranged to cover the uppermost of the wirings exposed at the opening of the passivation film and a periphery of the opening of the passivation film and which includes an extension portion disposed on a portion of the periphery of the opening in the surface of the passivation film; and
    a dielectric layer arranged to cover at least the electrode; wherein
    an adhesive resin is filled in a concave portion on a side of the surface of the passivation film, and surfaces of the dielectric layer and the adhesive resin are included in the same plane.

2. The semiconductor integrated circuit device according to claim 1, wherein a region in contact with the extension portion of the electrode is flat along a surface of the passivation film.

3. The semiconductor integrated circuit device according to claim 1, further comprising an auxiliary layer arranged on the surface of the passivation film so as to expose at least a portion of the opening of the passivation film, wherein the extension portion of the electrode is disposed on a surface of the auxiliary layer.

4. A mounting structure of a semiconductor integrated circuit device comprising:
    a circuit board including an electrode; and
    the semiconductor integrated circuit device according to claim 1 mounted on the circuit board; wherein
    the extension portion of the electrode of the semiconductor integrated circuit board is opposed to a surface of the electrode of the circuit board with a dielectric layer of the semiconductor integrated circuit board therebetween.

5. A method for manufacturing a semiconductor integrated circuit device, the method comprising the steps of:
    forming a semiconductor substrate having a plurality of wirings laminated sequentially on a semiconductor substrate main body with insulating films therebetween;
    forming a passivation film on a principal surface of the semiconductor substrate that has the wirings laminated thereon, the passivation film having an opening at which at least a portion of the uppermost of the wirings is exposed;
    forming an electrode on a surface of the passivation film so as to cover the opening and a periphery of the opening of the passivation film and which includes an extension portion disposed on a portion of the periphery of the opening in the surface of the passivation film;
    forming a dielectric layer so as to cover at least the electrode; and
    disposing an adhesive resin in a concave portion on a side of the surface of the passivation film such that surfaces of the dielectric layer and the adhesive resin are included in the same plane.

6. The method for manufacturing a semiconductor integrated circuit device according to claim 5, further comprising the step of forming an auxiliary layer having a flat surface on a surface of the passivation film so as to expose at least a portion of the opening of the passivation film after the step of forming a passivation film.

7. The method for manufacturing a semiconductor integrated circuit device according to claim 5, wherein in the step of forming an electrode, the electrode is formed by forming a film of an electrically conductive material along the passivation film.

8. The method for manufacturing a semiconductor integrated circuit device according to claim 5, wherein in the step of disposing an adhesive resin, after the adhesive resin is disposed on the surface side of the passivation film, the adhesive resin is polished until at least a portion of the dielectric film that covers the extension portion of the electrode is exposed.

9. The method for manufacturing a semiconductor integrated circuit device according to claim 5, wherein in the step of disposing an adhesive resin, the adhesive resin in an uncured state is contact-bonded to the dielectric layer.

10. The method for manufacturing a semiconductor integrated circuit device according to claim 5, wherein in the step of disposing an adhesive resin, the adhesive resin in an uncured state is applied to the dielectric layer.

* * * * *